United States Patent [19]
Tran

[11] Patent Number: 6,163,477
[45] Date of Patent: Dec. 19, 2000

[54] MRAM DEVICE USING MAGNETIC FIELD BIAS TO IMPROVE REPRODUCIBILITY OF MEMORY CELL SWITCHING

[75] Inventor: Lung T. Tran, Saratoga, Calif.

[73] Assignee: Hewlett Packard Company, Palo Alto, Calif.

[21] Appl. No.: 09/370,087

[22] Filed: Aug. 6, 1999

[51] Int. Cl.[7] .................................................. G11C 11/15
[52] U.S. Cl. ........................... 365/173; 365/171; 365/158
[58] Field of Search ..................................... 365/171, 173, 365/158, 55

[56] References Cited

U.S. PATENT DOCUMENTS

| | | | |
|---|---|---|---|
| 5,640,343 | 6/1997 | Gallagher et al. | 365/171 |
| 5,748,524 | 5/1998 | Chen et al. | 365/173 |
| 5,793,697 | 8/1998 | Scheuerlein | 365/171 X |
| 5,838,608 | 11/1998 | Zhu et al. | 365/158 |

*Primary Examiner*—Huan Hoang

[57] ABSTRACT

A magnetic field bias is applied to memory cells of an MRAM device during a write operation. The magnetic field bias, which may be applied by a permanent magnet or an electromagnet, can improve reproducibility of memory cell switching.

15 Claims, 5 Drawing Sheets

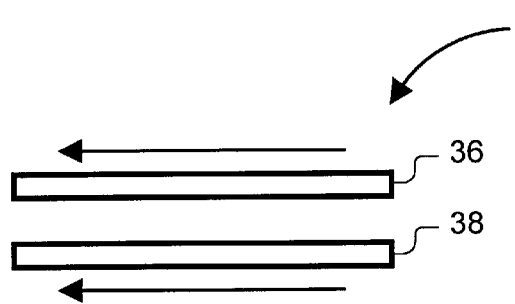
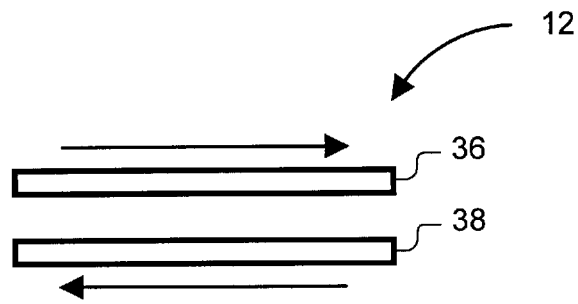
FIG. 2a  FIG. 2b
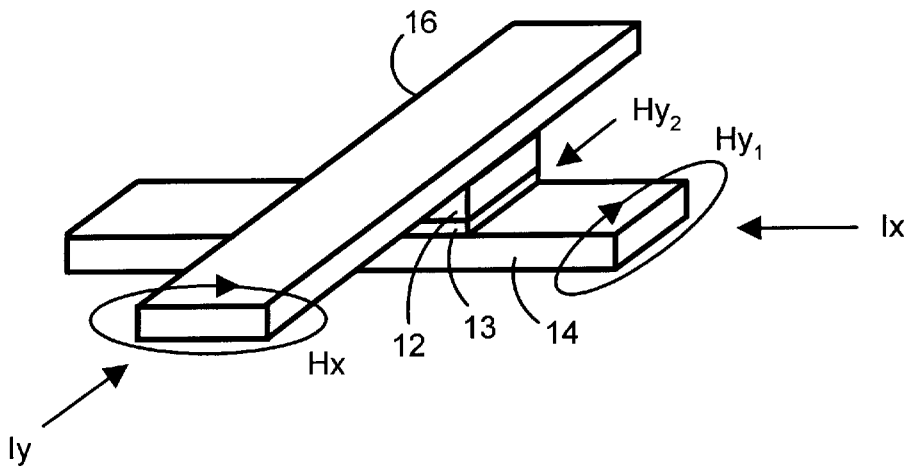
FIG. 3
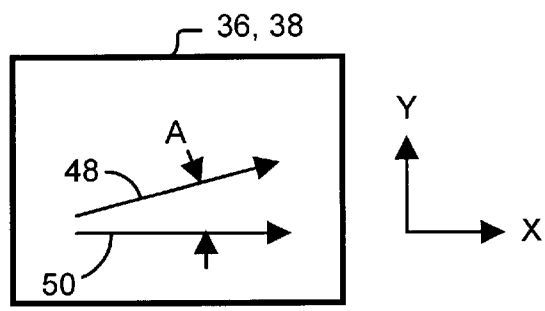
FIG. 6

MRAM DEVICE USING MAGNETIC FIELD BIAS TO IMPROVE REPRODUCIBILITY OF MEMORY CELL SWITCHING

BACKGROUND OF THE INVENTION

The invention relates to random access memory for data storage. More specifically, the invention relates to a magnetic random access memory device including an array of memory cells.

Magnetic Random Access Memory ("MRAM") is a non-volatile memory that is being considered for long term data storage. Performing read and write operations on MRAM devices would be orders of magnitude faster than performing read and write operations on conventional long term storage devices such as hard drives. In addition, the MRAM devices would be more compact and would consume less power than hard drives and other conventional long term storage devices.

A typical MRAM device includes an array of memory cells. Word lines extend along rows of the memory cells, and bit lines extend along columns of the memory cells. Each memory cell is located at a cross point of a word line and a bit line. A memory cell stores a bit of information as an orientation of a magnetization. The magnetization orientation of each memory cell assumes one of two stable orientations at any given time. These two stable orientations, parallel and anti-parallel, represent logic values of "1" and "0." The magnetization orientation of a selected memory cell may be changed by supplying currents to a word line and a bit line crossing the selected memory cell. The currents create two orthogonal magnetic fields that, when combined, switch the magnetization orientation of a selected memory cell from parallel to anti-parallel or vice versa.

However, switching of the memory cells is not always reliable. Sometimes, the combined magnetic fields might not cause a memory cell to switch reliably from parallel to anti-parallel, or vice-versa. This problem is typically solved by increasing crystal anisotropy, coercivity or aspect ratio of the memory cells.

However, increasing the crystal anisotropy, coercivity or aspect ratio leads to another problem: the amount of current for switching the memory cells is also increased. Increasing the amount of current increases the amount of power consumed by the MRAM device. Increasing the amount of current also results in larger bit and word lines and write circuits to handle the higher currents. Resulting is a larger, more expensive MRAM device.

Therefore, a need exists to improve reproducibility or reliability of switching MRAM devices without increasing the switching current.

SUMMARY OF THE INVENTION

This need is met by an MRAM device according to the present invention. According to one aspect of the present invention, a first magnetic field is applied to a selected memory cell; and current is supplied to first and second traces crossing the selected memory cell. The currents create second and third orthogonal magnetic fields. The first magnetic field has the same polarity and direction as the second magnetic field. A combination of the first, second and third magnetic fields causes the selected memory cell to switch. Applying the first magnetic field improves reproducibility of switching the selected memory cell. It also allows the switching currents to be lowered.

Other aspects and advantages of the present invention will become apparent from the following detailed description, taken in conjunction with the accompanying drawings, illustrating by way of example the principles of the invention.

BRIEF DESCRIPTION OF THE DRAWINGS

FIGS. 2a and 2b are illustrations of parallel and anti-parallel magnetization of a memory cell;

FIG. 3 is an illustration of an MRAM memory cell that has been selected during a write operation, the memory cell including a magnetic film for applying a magnetic field bias;

FIG. 6 is an illustration of an alternative MRAM memory cell, magnetization of the memory cell being oriented to provide a magnetic field bias;

DETAILED DESCRIPTION OF THE INVENTION

Figure 1:
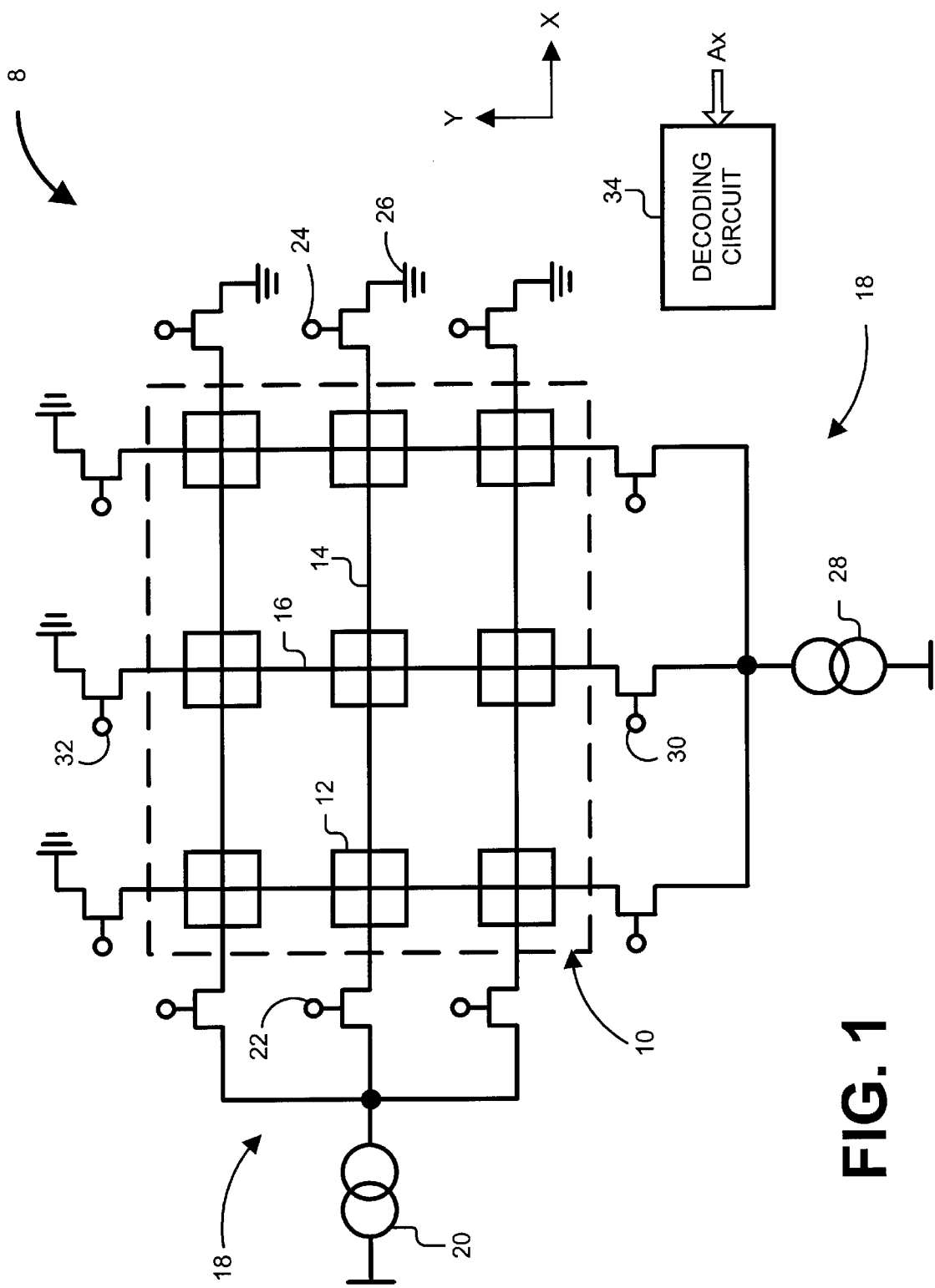
FIG. 1 is an illustration of an MRAM device including an array of memory cells.

As shown in the drawings for purposes of illustration, the present invention is embodied in a Magnetic Random Access Memory device. A magnetic field bias is applied to the memory cells during a write operation. Applying the magnetic field bias improves reproducibility of switching the memory cells. Applying the magnetic field bias also reduces the power needs to switch the memory cells.

Reference is now made to FIG. 1, which illustrates an MRAM device 8 including an array 10 of memory cells 12. The memory cells 12 are arranged in rows and columns, with the rows extending along an x-direction and the columns extending along a y-direction. Only a relatively small number of memory cells 12 are shown to simplify the description of the invention. In practice, arrays of 1024× 1024 memory cells or larger may be used.

Traces functioning as word lines 14 extend along the x-direction in a plane on one side of the memory cell array 10. Traces functioning as bit lines 16 extend along the y-direction in a plane on an opposite side of the memory cell array 10. There may be one word line 14 for each row of the array 10 and one bit line 16 for each column of the memory cell array 10. Each memory cell 12 is located at a crossing point of a corresponding word line 14 and bit line 16.

The MRAM device 8 further includes a write circuit 18 for supplying currents Ix and Iy to the word and bit lines 14 and 16 during a write operation. The write circuit 18 includes a word line current source 20 and first and second row select transistors 22 and 24 for each word line 14. Each first row select transistor 22 is coupled between a corresponding word line 14 and the word line current source 20. Each second row select transistor 24 is coupled between a corresponding word line 14 and a reference potential 26 (e.g., ground).

The write circuit 18 further includes a bit line current source 28 and first and second column select transistors 30 and 32 for each bit line. Each first column select transistor 30 is coupled between a corresponding bit line 16 and the bit line current source 28. Each second column select transistor 32 is coupled between a corresponding bit line 16 and the reference potential 26.

Data may be written in m-bit words. If the data is written in m-bit words, a decoding circuit 34 decodes an address Ax and turns on the appropriate row and column select transistors 22, 24, 30 and 32 (traces extending from the decoding circuit 34 to gates of the select transistors 22, 24, 30 and 32 are not shown).

The MRAM device 8 also includes a read circuit for sensing the resistance of each selected memory cell 12. The read circuit is not shown in order to simplify the explanation of the present invention. Additionally, the write circuit 18 has been simplified in order to simplify the explanation of the present invention. Although only a single word line current source 20 for all of the word lines 14 is shown, the write circuit 18 may include more than one word line current source 20. Although only a single bit line current source 28 for all of the bit lines 16 is shown, the write circuit 18 may include more than one bit line current source 28. As for connecting switches and current sources to the word and bit lines 14 and 16, many different ways are available.

The memory cells 12 are not limited to any particular type of device. For example the memory cells 12 may be spin dependent tunneling ("SDT") devices. A typical SDT device includes a "pinned" layer and a "free" layer. The pinned layer has a magnetization that is oriented in a plane, but fixed so as not to rotate in the presence of an applied magnetic field in a range of interest. The free layer has a magnetization orientation that is not pinned. Rather, the magnetization can be oriented in either of two directions along an axis (the "easy" axis) lying in a plane. If the magnetization of the free and pinned layers 36 and 38 are in the same direction, the orientation is said to be "parallel" (as indicated by the arrows in FIG. 2a). If the magnetization of the free and pinned 36 and 38 layers are in opposite directions, the orientation is said to be "anti-parallel" (as indicated by the arrows in FIG. 2b).

The free layer 36 and the pinned layer 38 are separated by an insulating tunnel barrier. The insulating tunnel barrier allows quantum mechanical tunneling to occur between the free and pinned layers. This tunneling phenomenon is electron spin dependent, making the resistance of the SDT device a function of the relative orientations of the magnetization of the free and pinned layers 36 and 38.

For instance, resistance of a memory cell 12 is a first value R if the orientation of magnetization of the free and pinned layers 36 and 38 is parallel (see FIG. 2a). Resistance of the memory cell 12 is increased to a second value R+ΔR if the magnetization of orientation is changed from parallel to anti5 parallel (see FIG. 2b).

Data is stored in a memory cell 12 by orienting the magnetization along the easy axis of the free layer 36. A logic value of "0" may be stored in the memory cell 12 by orienting the magnetization of the free layer 36 such that the magnetization orientation is parallel, and a logic value of "1" may be stored in the memory cell 12 by orienting the magnetization of the free layer 36 such that the magnetization orientation is anti-parallel.

The logic value stored in a selected memory cell 12 may be read by sensing the resistance of the selected memory cell 12. For example, a voltage may be applied across the word and bit lines 14 and 16 crossing the selected memory cell 12, thereby causing a current to be generated. The current can be measured to determine whether the memory cell has a resistance of value R corresponding to one logic value or the value R+ΔR corresponding to the other logic value.

Each memory cell 12 retains the orientation of magnetization, even in the absence of external power. Therefore, the memory cells 12 are non-volatile.

Additional reference is now made to FIG. 3, which illustrates a selected memory cell 12 during a write operation. When the memory cell 12 is selected, the currents Ix and Iy are supplied to the word and bit lines 14 and 16 crossing the memory cell 12. Supplying the current Ix to the word line 14 causes a magnetic field Hy to form around the word line 14. Supplying the current Iy to the bit line 16 causes a magnetic field Hx to form around the bit line 16.

Figure 4:
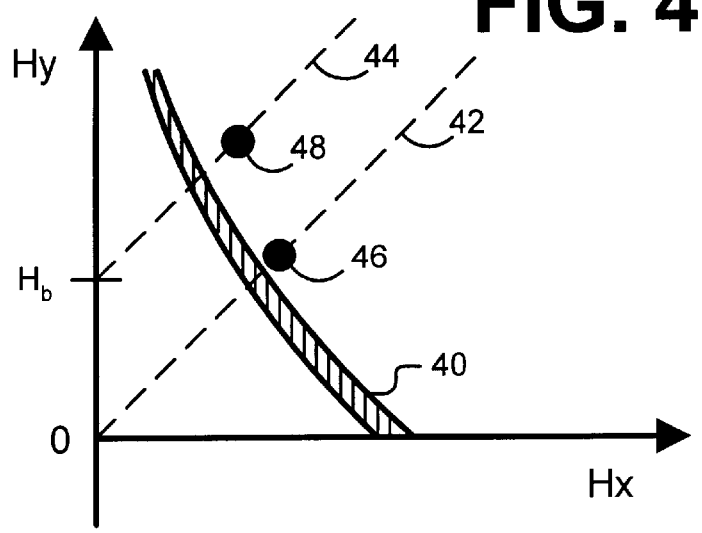
FIG. 4 is an illustration of a switching curve for an MRAM memory cell.

Reference is now made to FIG. 4, which shows a switching curve 40 for the memory cell 12. Points lying to the right of the switching curve 40 will cause the memory cell 12 to switch. First and second dashed lines 42 and 44 indicate magnetic fields created by equal amplitude currents (i.e., Ix=Iy) that re supplied to the bit and word lines 14 and 16. Switching of the memory cell 12 may occur at a first point 46 along the first dashed line 42.

Figure 5:
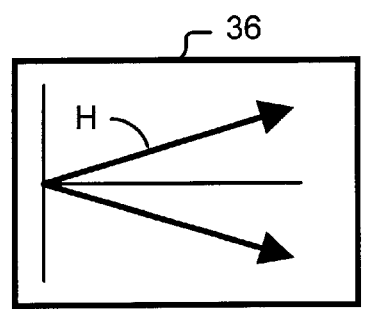
FIG. 5 is an illustration of multiple switching domains in a memory cell.

However, the memory cell 12 might not switch at the first point 46 because the switching curve 40 has a region of uncertainty (indicated by the cross hatched region). When the currents Ix and Iy are applied to the word line 14, the resulting magnetic field H can rotate along either of two paths (see FIG. 5). If the magnetic field H rotates along the path in one of the quadrants, switching will occur. However, if the magnetic field H rotates along a path in the other of the quadrants, the switching might not occur. Thus the uncertainty. The uncertainty region fans out and becomes wider towards the bottom of the switching curve 40. Points lying within or near this uncertainty region, such as the first switching point 46, might not cause the memory cell 12 to switch reliably.

The switching currents Ix and Iy could be increased to ensure reliable switching. However, increasing the switching currents Ix and Iy would increase the power consumption of the MRAM device. It would also result in larger bit and word lines and write circuits to handle the higher currents. Resulting would be a larger, more expensive MRAM device.

In the alternative, a magnetic field bias $H_b$ may be applied to the memory cell 12. The magnetic field bias $H_b$ alone does not cause the memory cell 12 to switch. However, the magnetic field bias $H_b$ forces the magnetic field H to rotate consistently in the same quadrant, along a single path. Thus, applying the magnetic field bias $H_b$ increases the reproducibility of switching.

The magnetic field bias $H_b$ also reduces the amount of current Ix and Iy needed to switch the memory cell 12. Compare the first switching point 46 to a second switching point 48, which may be used when the magnetic field bias $H_b$ is applied. The second switching point 48 occurs at a lower word line current Ix than the first switching point 46. In addition, the second switching point 48 occurs at a lower bit line current Iy than the first switching point 46. Furthermore, the second switching point 48 is at a higher, more reliable position along the switching curve 40, where the uncertainty region is not as large. Thus, applying the magnetic field bias $H_b$ improves the reproducibility of switching the memory cell 12 and also lowers power consumption.

The magnetic field bias $H_b$ may be lower than the switching field Hy. For example, the magnetic field bias $H_b$ may be about 0.25 of the switching field Hy about the word lines 14. In addition, the switching currents Ix and Iy may be unequal. However, the switching currents Ix and Iy and the magnetic fields Hy and $Hy_b$ that are actually applied to an MRAM device will be device-dependent.

There are various ways in which the magnetic field bias $H_b$ may be applied to the memory cell 12. FIG. 3 shows an independent magnetic film 13 that applies the magnetic field bias $H_b$ to the memory cell 12. Magnetization of the film 13 is in the same direction as the switching field Hy about the word lines 14. The combined magnetic fields $Hx+Hy+H_b$ in the vicinity of the free layer 36 allow memory cell switching to occur at the second switching point 48.

The magnetic film 13 may be a hard magnet or a soft magnet. If the magnetic film 13 is a soft magnet, a current Ix may be applied to the word line 14 to magnetize the film 13 and create the magnetic field bias $H_b$.

The magnetic film 13 may be made of a variety of magnetic materials. For example, the magnetic film 13 may be made of an alloy of cobalt and chrome, the alloy having a thickness comparable to the thickness of the free layer 36. During fabrication of the MRAM device, the magnetic film 13 may be deposited and patterned with the word lines 14. In the alternative, the magnetic film 13 may be formed integrally with the memory cell 12.

FIG. 6 shows another way in which the magnetic field bias $H_b$ may be applied to the memory cell 12. Magnetization 48 of the fixed layer 38 may be angularly rotated relative to magnetization 50 of the free layer 36 by an angle A. Resulting would be a magnetization component in the y-direction and a magnetic field bias $H_b$ applied to the device. This rotation of the fixed layer 38 relative to the free layer 36 may be accomplished by annealing the fixed layer 38 in a magnetic field at the angle A.

Figure 7:
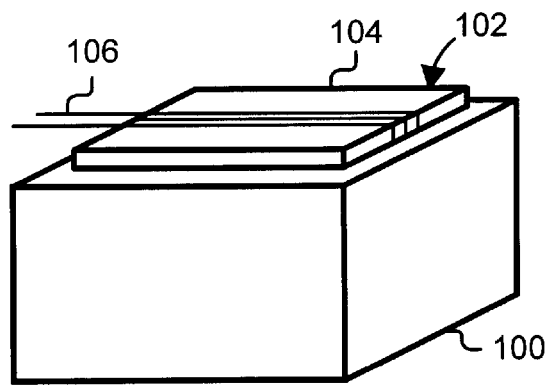
FIG. 7 is an illustration of an MRAM device including an electromagnet for applying a magnetic field bias.

FIG. 7 shows yet another way in which the magnetic field bias $H_b$ may be applied to the memory cell 12. The magnetic field bias $H_b$ may be applied by an electromagnet 102 positioned over most or all of an MRAM device 100.

The electromagnet 102 includes a film 104 and a coil 106 wrapped around the film 104. The film 104 may be made of material such as Permalloy (e.g., NiFe). The coil 106 may be made of a material such as copper. The coil 106 may be wrapped using a technique similar to that used in write head manufacture. Increasing the number of windings of the coil 106 will increase the magnetic field bias $H_b$ applied to the memory cells 12 of the MRAM device 100.

Figure 8:
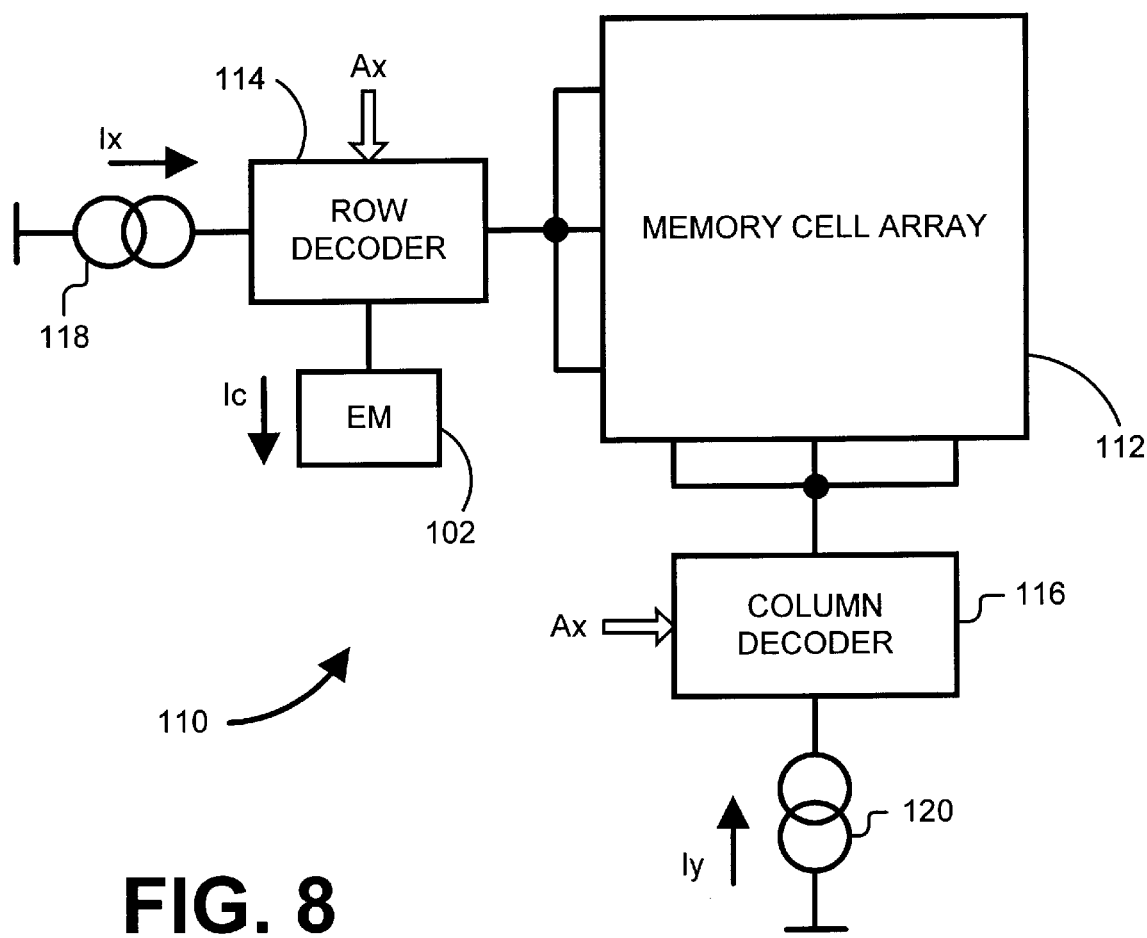
FIG. 8 is an illustration of an array of memory cells and write circuitry for the MRAM device of FIG. 7.

Referring now to FIG. 8, the MRAM device 110 includes an array 112 of memory cells, a word line decoder 114, a bit line decoder 116, a source 118 for supplying a word line current Ix in response to an address Ax during a write operation, and a source 120 for supplying a bit line current Iy in response to address Ax during a write operation.

The word line decoder 114 also supplies a current Ic to the coil 106 during a write operation. The current Ic energizes the coil 106 and causes the magnetic field bias $H_b$ to be created. Thus, during a write operation, all of the memory cells in the array 112 will see the magnetic field bias $H_b$.

Figure 9:
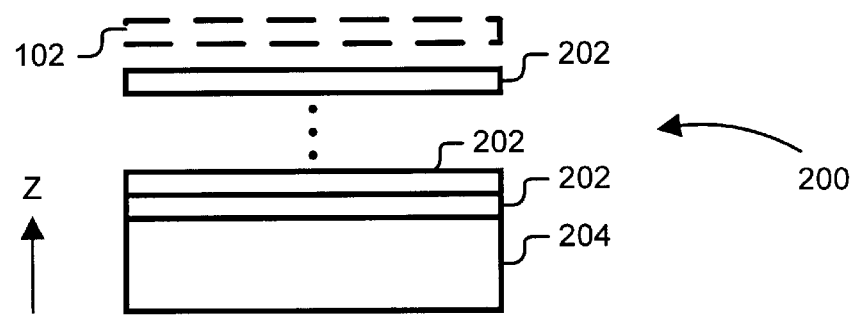
FIG. 9 is an illustration of an MRAM chip including multiple levels.

Reference is now made to FIG. 9, which illustrates a multi-level MRAM chip 200. The MRAM chip 200 includes a number N of memory cell levels 202 that are stacked in a z-direction on a substrate 204. The number N is positive integer where $N \leq 1$. The memory cell levels 202 may be separated by insulating material (not shown) such as silicon dioxide. Read and write circuits may be fabricated on the substrate 204. The read and write circuits may include additional multiplexers for selecting the levels that are read from and written to.

If an electromagnet 102 (shown in dashed) is used to apply the magnetic field bias $H_b$, the electromagnet 102 may be positioned above the chip 200. All of the levels of chip 200 would see the magnetic field bias. The electromagnet 102 could be made of a piece 104 of soft-iron or a ferrite with wire 106 wound around it and mounted on top of a plastic casing of the MRAM chip.

Thus disclosed are MRAM devices in which a magnetic field bias limits the rotation of magnetization to a single path in the free layer. Consequently, the magnetic field bias increases the switching reliability of memory cells having low aspect ratios (e.g., square-shaped memory cells) and memory cells having free layers made of a low crystal anisotropy and low coercivity (e.g., NiFe).

Lowering the aspect ratio of the memory cells, in turn, lowers the area of the memory cells. This allows square memory cells to be fabricated at the minimum lithographic feature size. Consequently, higher density memory and lower device cost can be achieved.

The magnetic field bias also allows the use of lower currents to switch the memory cells. Consequently, power consumption may be reduced. In addition, reducing the current allows smaller word lines, bit lines and write circuits to be used. This allows memory density and device cost to be further reduced.

In the alternative, the magnetic field bias allows the use of more stable memory cells without increasing power consumption. The device may include memory cells having higher aspect ratios (e.g., rectangular-shaped memory cells) and memory cells having high crystal anisotropy and coercivity. Such memory cells are more likely to have a single domain. Consequently, memory cell reliability may be increased without increasing power consumption.

Figure 10:
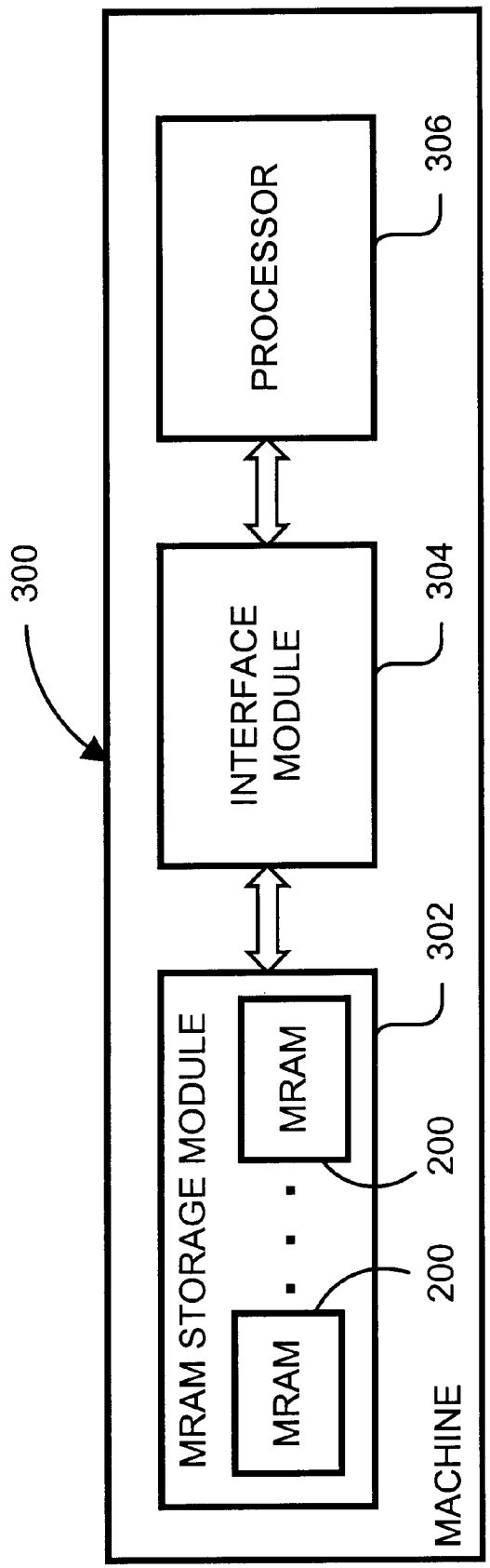
FIG. 10 is an illustration of a machine including one or more MRAM chips.

The MRAM device according to the present invention could be used in a wide variety of applications. FIG. 10 shows an exemplary general application for one or more MRAM chips 200. The general application is embodied by a machine 300 including an MRAM storage module 302, an interface module 304 and a processor 306. The MRAM storage module 302 includes one or more MRAM chips 200 for long term storage. The interface module 304 provides an interface between the processor 306 and the MRAM storage module 302. The machine 300 could also include fast volatile memory (e.g., SRAM) for short term storage.

For a machine 300 such as a notebook computer or personal computer, the MRAM storage module 302 might include a number of MRAM chips 200 and the interface module 304 might include an EIDE or SCSI interface. For a machine 300 such as a server, the MRAM storage module 302 might include a greater number of MRAM chips 200, and the interface module 304 might include a fiber channel or SCSI interface. Such MRAM storage modules 302 could replace or supplement conventional long term storage devices such as hard drives.

For a machine 300 such as a digital camera, the MRAM storage module 302 might include a smaller number of MRAM chips 200 and the interface module 304 might include a camera interface. Such an MRAM storage module 302 would allow long term storage of digital images on-board the digital camera.

The MRAM device according to the present invention offers many advantages over conventional long-term data storage devices such as hard drives. Accessing data from the MRAM devices is orders of magnitude faster than accessing data from conventional long-term storage devices such as hard drives. Additionally, MRAM devices are more compact than hard drives.

The invention is not limited to the specific embodiments described and illustrated above. For instance, the invention is not limited to the use of spin dependent tunneling devices. Other types of devices that could be used include, but are not limited to, giant magnetoresistance ("GMR") devices.

The invention has been described in connection with the rows being oriented along the easy axis. However, the rows and columns could be transposed, in which case the columns would be oriented along the easy axis, and the magnetic field bias would be created about the word lines.

Accordingly, the invention is not limited to the specific embodiments described and illustrated above. Instead, the invention is construed according to the claims that follow.

What is claimed is:

1. A method of writing to a selected memory cell of an MRAM device, the selected memory cell being crossed by first and second traces, the method comprising:

applying a first magnetic field to the selected memory cell;

supplying current to the first and second traces to create second and third magnetic fields, the first, second and third magnetic fields in combination causing the selected memory cell to switch;

the first magnetic field having the same polarity and direction as the second magnetic field;

the first magnetic field improving reproducibility of switching the selected memory cell.

2. The method of claim 1, wherein the first magnetic field is applied by applying a permanent magnetic bias to the memory cell.

3. The method of claim 2, wherein the permanent magnetic bias is applied by the addition of an independent magnetic film to the memory cell.

4. The method of claim 2, wherein the memory cell includes a free layer and a pinned layer, and wherein the permanent magnetic bias is applied by the angular rotation of the pinned layer magnetization relative to the free layer magnetization.

5. The method of claim 1, wherein the first magnetic field is selectively applied to the memory cell during switching.

6. The method of claim 1, wherein the first magnetic field is electromagnetically applied to the memory cell during switching.

7. The method of claim 1, wherein the first magnetic field has a strength of about one-quarter the second magnetic field.

8. An MRAM device comprising:

an array of memory cells;

rows of first traces crossing the memory cells;

columns of second traces crossing the memory cells means for applying a first magnetic field to selected memory cells;

means for supplying current to selected first and second traces to create second and third magnetic fields, the first, second and third magnetic fields in combination causing memory cells crossed by both selected traces to switch;

the first magnetic having the same polarity and direction as the second magnetic field;

the first magnetic field limiting rotation of magnetization in a free layer of a selected memory cell to a single path.

9. The device of claim 8, wherein the means for applying the first magnetic field includes means for applying a continual magnetic field bias to each memory cell.

10. The device of claim 8, wherein the means for applying the first magnetic field includes an electromagnet for applying the first magnetic field to the entire array of memory cells.

11. An MRAM device comprising:

an array of memory cells;

a plurality of word lines extending in an x-direction, each word line crossing a row of memory cells; and a plurality of bit lines extending in a y-direction, each bit line crossing a column of memory cells;

each memory cell providing a fixed magnetic field bias about the y-direction, the fixed magnetic bias improving switching reproducibility.

12. The device of claim 11, wherein each memory cell includes an independent magnetic film for providing the magnetic field bias.

13. The device of claim 12, wherein the independent magnetic film of each memory cell is deposited on a crossing word line.

14. The device of claim 11, wherein each memory cell includes a pinned layer and a free layer, magnetization of the pinned layer being angularly rotated relative to magnetization of the free layer to apply the magnetic field bias.

15. An MRAM device comprising:

an array of memory cells;

a plurality of first traces extending in a first direction, each first trace crossing a corresponding memory cell; and a plurality of second traces extending in a second direction, each second trace crossing a corresponding memory cell;

an electromagnet proximate the array; and a write circuit coupled to the electromagnet and the first and second traces for providing first and second currents to traces crossing selected memory cells during write operations, the write circuit also supplying a third current to the electromagnet during the write operation;

the currents creating first, second and third magnetic fields that, when combined, cause the selected memory cells to switch.

* * * * *